(12) United States Patent
Hamamura et al.

(10) Patent No.: US 9,000,448 B2
(45) Date of Patent: Apr. 7, 2015

(54) SILICON CARBIDE SEMICONDUCTOR DEVICE

(75) Inventors: Hirotaka Hamamura, Kodaira (JP); Yasuhiro Shimamoto, Tokorozawa (JP); Hiroyuki Okino, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/884,956

(22) PCT Filed: Mar. 29, 2011

(86) PCT No.: PCT/JP2011/057787
§ 371 (c)(1),
(2), (4) Date: May 11, 2013

(87) PCT Pub. No.: WO2012/131898
PCT Pub. Date: Oct. 4, 2012

(65) Prior Publication Data
US 2013/0234163 A1    Sep. 12, 2013

(51) Int. Cl.
| H01L 29/15 | (2006.01) |
| H01L 29/66 | (2006.01) |
| H01L 29/51 | (2006.01) |
| H01L 29/78 | (2006.01) |
| H01L 29/16 | (2006.01) |

(52) U.S. Cl.
CPC ........ H01L 29/66477 (2013.01); H01L 29/513 (2013.01); H01L 29/518 (2013.01); H01L 29/66068 (2013.01); H01L 29/7802 (2013.01); H01L 29/1608 (2013.01)

(58) Field of Classification Search
USPC .............. 257/77, E21.054, E21.055, E21.065
See application file for complete search history.

(56) References Cited

U.S. PATENT DOCUMENTS

2005/0230686 A1 *  10/2005  Kojima et al. ................... 257/77
2011/0006310 A1 *  1/2011   Nagasawa et al. ............... 257/77

FOREIGN PATENT DOCUMENTS

| JP | 2004-511101 A | 4/2004 |
| JP | 2008-117878 A | 5/2008 |
| JP | 2009-016530 A | 1/2009 |
| WO | WO 02/29874 A2 | 4/2002 |

OTHER PUBLICATIONS

Harada, Shinsuke, et al., "High Channel Mobility in Normally-Off 4H-SiC Buried Channel MOSFETs", IEEE Electron Device Letters, Jun. 2001, pp. 272-274, vol. 22—No. 6.

* cited by examiner

*Primary Examiner* — Timor Karimy
(74) *Attorney, Agent, or Firm* — Miles & Stockbridge P.C.

(57) ABSTRACT

A MOSFET having a high mobility may be obtained by introducing nitrogen to the channel region or the interface between the gate dielectric film and the SiC substrate of the SiC MOSFET, but there is a problem that a normally-on MOSFET is obtained. For realizing both a high mobility and normally-off, and for providing a SiC MOSFET having further high reliability, nitrogen is introduced to the channel region of the SiC substrate or the interface between the gate dielectric film and the SiC substrate, and furthermore a metal oxide film having a thickness of 10%, or less of the total thickness of the gate dielectric film is inserted in the gate dielectric film.

8 Claims, 5 Drawing Sheets

SILICON CARBIDE SEMICONDUCTOR DEVICE

TECHNICAL FIELD

The present invention relates to a silicon carbide semiconductor device.

BACKGROUND ART

Silicon carbide (SiC) has a dielectric breakdown electric field that is larger than Si by 10 times or more and is capable of making a drift layer for maintaining withstand voltage to have a smaller thickness and a high concentration, and thus is a material capable of decreasing loss of an FET (field effect transistor). Accordingly, a MOSFET (metal oxide semiconductor FET) using SiC is receiving attention as a next-generation switching device with high withstand voltage and low loss.

As an example of a MOSFET, the operation principle thereof will be described, with reference to FIG. 2. In the figure, numeral 1 denotes an n$^+$ substrate as a drain region, 2 denotes an n$^-$ drift layer, 3 denotes a p base region, 4 denotes a p$^+$ contact region, 5 denotes an n$^+$ source region, 6 denotes a gate dielectric film, 7 denotes a gate electrode, 8 denotes an interlayer dielectric film for electrically insulating the source and the gate, 9 denotes a source electrode, and 10 denotes a drain electrode. In the operation of the MOSFET, on application of a positive voltage on the gate electrode 7 in the state where a voltage is applied between the drain electrode 10 and the source electrode 9, an electron inversion layer is formed on the surface of the base region 3. As a result, an electric current flows from the drain electrode 10 to the source electrode 10 through the drain region 1, the drift layer 2 and the source region 5.

One of the factors that influence the capability of the device of the MOSFET is the quality of the interface between SiC and the gate dielectric film. The gate dielectric film is generally formed with silicon dioxide by such a method as a thermal oxidation method or a chemical vapor deposition (CVD) method, and the so-called MOS interface between silicon dioxide and silicon carbide has a large number of interface states (traps), which results in problems including considerable decrease of the channel mobility, increase of the on-resistance of the device, and increase of the loss on on-operation.

As a method for reducing the interface states and enhancing the mobility, for example, PTL 1 reports a method of performing a heat treatment with dinitrogen monoxide (N$_2$O) gas after the thermal oxidation, or forming an oxide film by the nitriding treatment.

For example, PTL 2 reports a method of performing a direct heat treatment of SiC with dinitrogen monoxide (N$_2$O) gas or nitrogen monoxide (NO), and then forming an oxide film by a deposition method.

For example, NPL 1 reports a method of performing implantation of nitrogen to a SiC substrate and then forming a gate dielectric film.

For example, PTL 3 reports a method of forming SiO$_2$ to a thickness of from 0.3 to 0.9 nm and depositing thereon an aluminum oxide at a temperature of 300° C. or less to a thickness of from 10 to 100 nm, as a gate dielectric film on a SiC substrate.

As an example of using a high dielectric material film as a gate dielectric film, for example, PTL 4 reports a method of forming SiO$_2$, depositing thereon a high dielectric material film, and depositing further thereon SiO$_2$, as a gate dielectric film on a SiC substrate, thereby enhancing the dielectric breakdown characteristics.

CITATION LIST

Patent Literature

PTL 1: JP-A-2004-511101
PTL 2: JP-A-2008-117878
PTL 3: JP-A-2009-16530

Non-Patent Literature

NPL 1: IEEE Electron Device Letters, Vol. 22, No. 6, pp. 272-274 (2001)

SUMMARY OF INVENTION

Technical Problem

However, the enhancement of the mobility by the aforementioned methods may have the following technical problems. The investigations made by the present inventors have revealed that the threshold voltage (Vth) of the MOSFET is shifted negatively in the case where the heat treatment is performed with N$_2$O after the thermal oxidation, the oxide film is formed by the nitriding treatment, the direct heat treatment is performed on SiC substrate with N$_2$O or NO and the oxide film is formed by a deposition method, or the implantation of nitrogen is performed to the SiC substrate and then the gate dielectric film is formed. The negative shift of the threshold voltage (Vth) makes the device normally-on and thus is not preferred from the standpoint of fail safe. Furthermore, the investigations made by the present inventors have revealed a problem that the reliability (including the dielectric breakdown characteristics and the stability of the threshold voltage on application of electric stress) may be deteriorated when the proportion in thickness of the high dielectric material film that is used in the gate dielectric film occupied in the total thickness of the gate dielectric film exceeds 10%. The proportion in thickness of the high dielectric material film occupied in the total thickness of the gate dielectric film is 90% or more in PTL 3 and 34% or more in PTL 4, both of which may cause problems in reliability.

Solution to Problem

For solving the problems, a representative embodiment of the invention is as follows a silicon carbide semiconductor device containing a MOSFET containing a silicon carbide substrate, a gate dielectric film formed on the silicon carbide substrate, a gate electrode formed on the gate dielectric film, and a source region formed on the silicon carbide substrate, the silicon carbide semiconductor device containing nitrogen that is introduced to a channel region of the MOSFET or an interface between the silicon carbide substrate and the gate dielectric film, and a metal oxide film having a thickness of 10% or less of the gate dielectric film in the gate dielectric film.

Advantageous Effects

Representative advantages that are obtained by the invention are briefly described below. The metal oxide film having a negative fixed charge in the gate dielectric film may shift the threshold voltage (Vth) of the MOSFET to the positive direction. That is, in combination with the measure for enhancing the mobility by introducing nitrogen to the channel region of the SiC substrate or the interface with the SiC substrate, both a high mobility and normally-off may be realized. Furthermore, by making the metal oxide film to have a thickness of 10% or less of the gate dielectric film, in addition to the aforementioned measures, both a high mobility and normally-off may be realized, and a silicon carbide semiconductor device that has further high reliability may be provided.

DESCRIPTION OF EMBODIMENTS

Example 1

Figure 1:
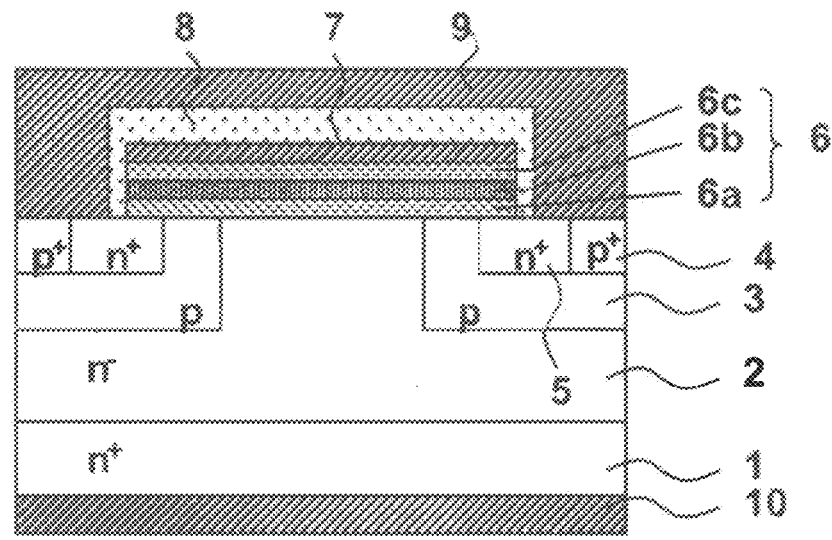
FIG. 1 is a cross sectional view showing a SiC MOSFET relating to Example 1 of the invention.
Figure 2:
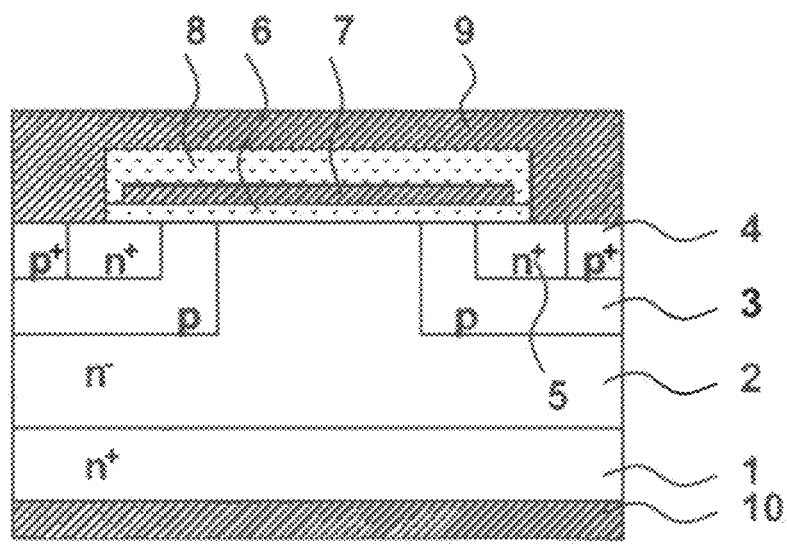
FIG. 2 is a cross sectional view showing a SiC MOSFET that is produced according to the ordinary art.

A cross sectional view of a silicon carbide semiconductor device according to Example 1 of the invention will be described with reference to FIG. 1. In the figure, numeral 1 denotes an $n^+$ substrate as a drain region, 2 denotes an $n^-$ drift layer, 3 denotes a p base region, 4 denotes a $p^+$ contact region, 5 denotes an $n^+$ source region, 6 denotes a gate dielectric film, 7 denotes a gate electrode, 8 denotes an interlayer dielectric film for electrically insulating the source and the gate, 9 denotes a source electrode, and 10 denotes a drain electrode. In the present specification, numerals 1 and 2 may together denote a SiC substrate, and nitrogen is introduced to the surface (channel region) of the $n^-$ drift layer 2 or the interface between the gate dielectric film and the SiC substrate.

The gate dielectric film 6 is constituted by a laminated film containing a first gate dielectric film 6a, a metal oxide film 6b and a second gate dielectric film 6c that are formed sequentially from the side of the SiC substrate, in which the first gate dielectric film 6a and the second gate dielectric film 6c each may be formed, for example, of a silicon oxide film, and the metal oxide film 6b may be formed, for example, of a metal oxide film, such as an aluminum oxide. The first gate dielectric film 6a has a thickness of 3 nm or more, and the metal oxide film 6b is remote from the surface of the SiC substrate by 3 nm or more. The total thickness of the gate dielectric film 6 is from 30 to 100 nm. The proportion in thickness of the metal oxide film 6b occupied in the total gate dielectric film 6 is 10% or less.

In the operation of the MOSFET, on application of a positive voltage on the gate electrode 7 in the state where a voltage is applied between the drain electrode 10 and the source electrode 9, an electron inversion layer is formed on the surface of the p base region 3. As a result, an electric current flows from the drain electrode 10 to the source electrode 10 through the drain region 1, the drift layer 2 and the source region 5.

A production method of the silicon carbide semiconductor device according to Example 1 of the invention will be described. A substrate is prepared that has an $n^-$ drift layer 2 laminated on a SiC substrate 1. On the $n^-$ drift layer 2, which is formed on the SiC substrate 1, an ion implantation mask material is patterned, and Al is ion implanted thereto for forming a p type base region 3. The ion implantation condition at this time is a dose amount of $3 \times 10^{13}$ cm$^{-2}$. According to the procedure, the p type base region 3 is formed to have a doping concentration of approximately from $1 \times 10^{17}$ to $1 \times 10^{18}$ cm$^{-3}$ and a thickness of approximately from 0.5 to 3.0 μm.

After forming the p type base region 3, an ion implantation mask material is patterned on the surface of the $n^-$ drift layer 2 and the p type base region 3, and Al is ion-implanted thereto for forming a $p^+$ contact region 4. After forming the $p^+$ contact region 4, an ion implantation mask material is patterned on the surface of $n^-$ drift layer 2, the p type base region 3 and the $p^+$ contact region 4, nitrogen is ion-implanted thereto for forming an $n^+$ source region 5. After forming the $n^+$ source region 5, an ion implantation mask material is patterned, and nitrogen is ion-implanted only to the $n^-$ drift layer 2 (channel region). According to the procedure, nitrogen is introduced to the channel region.

After removing the ion implantation mask material, a heat treatment at 1,700° C. is performed for activating Al and nitrogen thus implanted. A first gate dielectric film 6a is then formed by thermal oxidation within a process temperature range of approximately from 1,000 to 1,300° C. The first gate dielectric film 6a may be formed with NO gas or $N_2O$ gas. According to the procedure, nitrogen is introduced to the interface between the SiC substrate and the gate dielectric film. The first gate dielectric film 6a has a thickness of 3 nm or more. A metal oxide film 6b and a second gate dielectric film are then formed sequentially. The thickness of the metal oxide film 6b is 10% or less of the total thickness of the gate dielectric film 6. The total thickness of the gate dielectric film 6 is from 30 to 100 nm. The metal oxide film may be, for example, an aluminum oxide.

A gate electrode 7 is then formed with polycrystalline silicon. Thereafter, an interlayer dielectric film 8 for electric insulation is formed on the surface of the gate electrode 7. An etching mask material is patterned on the interlayer dielectric film 8, and the interlayer dielectric film 8 and the gate dielectric film 6 are processed by dry etching to form a contact window for exposing the $p^+$ contact region 4 and the $n^+$ source region 5. Finally, after removing the mask material, a drain electrode 10 is formed on the surface of the $n^+$ substrate 1. Thereafter, a source electrode 9 is formed in the prescribed contact window for exposing the $p^+$ contact region 4 and the n source region 5, thereby completing the MOSFET shown in FIG. 1.

In the production method, both the process of introducing nitrogen to the channel and the process of introducing nitrogen to the interface between the SiC substrate and the gate dielectric film are described, but this example includes a production method where one of the processes is not performed and the other thereof is performed for introducing nitrogen.

Figure 3:
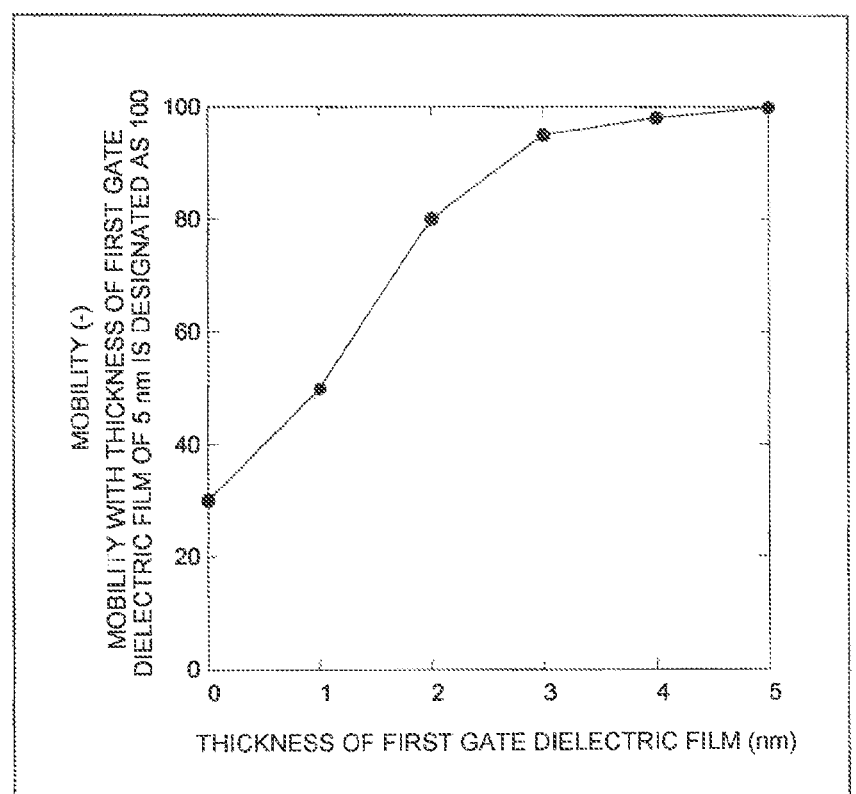
FIG. 3 shows the dependency of the mobility on the thickness of the first gate dielectric film of a SiC MOSFET according to an embodiment of the invention.

FIG. 3 shows the relationship between the thickness of the first gate dielectric film and the mobility of the MOSFET of the silicon carbide semiconductor device according to Example 1 of the invention. The mobility when the thickness of the first gate dielectric film is 5 nm is designated as 100. There is a tendency that the mobility is saturated at 3 nm or more, and thus the thickness of the first gate dielectric film is more preferably 3 nm or more.

Figure 4:
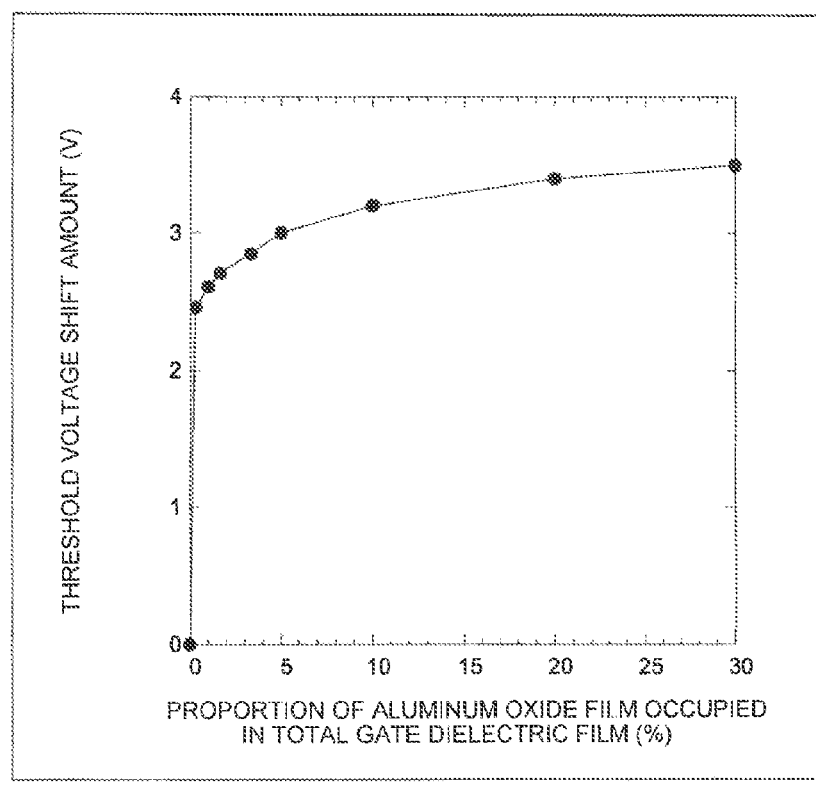
FIG. 4 shows the relationship between the threshold value (Vth) shift amount and the proportion in thickness of the aluminum oxide film occupied in the total thickness of the gate dielectric film of a SiC MOSFET according to an embodiment of the invention.
Figure 5:
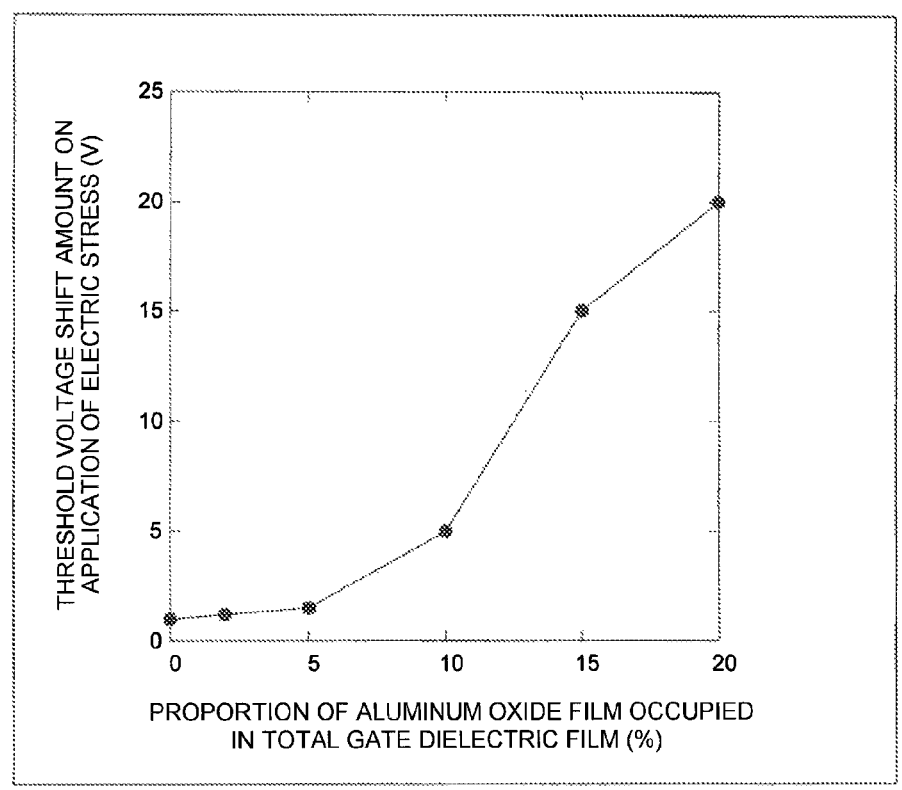
FIG. 5 shows the relationship between the gate voltage shift amount after application of electric stress and the proportion in thickness of the aluminum oxide film occupied in the total thickness of the gate dielectric film of a SiC MOSFET according to an embodiment of the invention.

The shift amount of the threshold voltage (Vth) is evaluated while varying the proportion in thickness of the aluminum oxide film 6b with respect to the total thickness of the gate dielectric film 6 of the silicon carbide semiconductor device according to Example 1 of the invention. The results are shown in FIG. 4. The ordinate shows the shift amount to the positive direction of the threshold voltage (Vth), and the abscissa shows the proportion in thickness of the aluminum oxide film 6b with respect to the total thickness of the gate dielectric film 6. The results show that the insertion of the aluminum oxide enables the shift of the threshold voltage (Vth) to the positive direction, and the shift amount thereof shows a tendency of saturation around 10% for the proportion in thickness of the aluminum oxide film 6b with respect to the total thickness of the gate dielectric film 6. It is also understood that the effect of shift of the threshold voltage (Vth) is obtained with an extremely small proportion of 0.5% or more.

The electric characteristics are evaluated while varying the proportion in thickness of the metal oxide film 6b with respect to the total thickness of the gate dielectric film 6 of the silicon carbide semiconductor device according to Example 1 of the invention, and it is thus understood that when the proportion exceeds 10%, the threshold voltage (Vth) of the transistor largely changes on application of a stress voltage to the gate dielectric film. This means that the reliability of the transistor is largely lowered when the proportion exceeds 10%. It is thus understood that the proportion in thickness of the metal oxide film 5b is preferably 10% or less from the standpoint of the reliability. It is also understood that the change amount of the stress voltage may be suppressed low when the proportion is 5% or less. From these results, the proportion in thickness of the metal oxide film 6b with respect to the total thickness of the gate dielectric film 6 is preferably 10% or less, and more preferably 5% or less.

In this example, an aluminum oxide is used as an example of the metal oxide film, but the invention is not limited thereto, and any one of a titanium oxide, a tantalum oxide, a hafnium oxide and a zirconium oxide may be used.

Example 2

Figure 6:
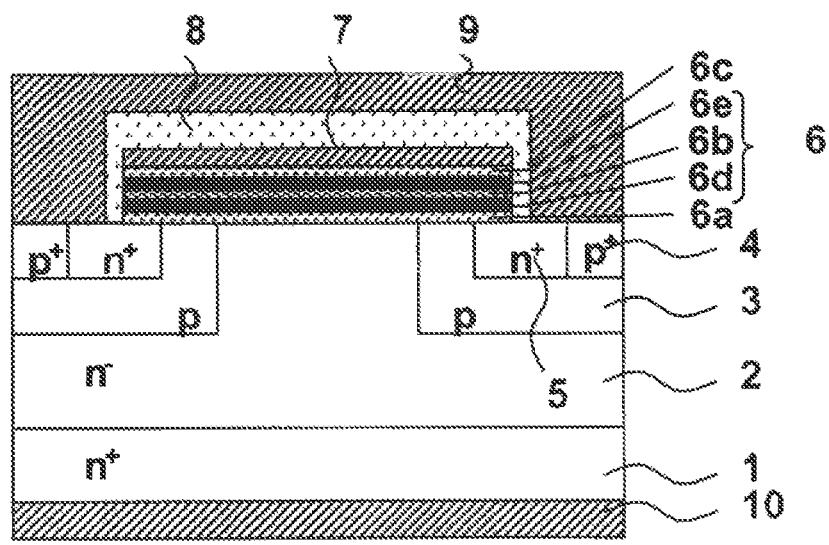
FIG. 6 is a cross sectional view showing a SiC MOSFET relating to Example 2 of the invention.

A cross sectional view of a silicon carbide semiconductor device according to Example 2 of the invention will be described with reference to FIG. 6. In the figure, numeral 1 denotes an n$^+$ substrate as a drain region, 2 denotes an n$^-$ drift layer, 3 denotes a p base region, 4 denotes a p$^+$ contact region, 5 denotes an n$^+$ source region, 6 denotes a gate dielectric film, 7 denotes a gate electrode, 8 denotes an interlayer dielectric film for electrically insulating the source and the gate, 9 denotes a source electrode, and 10 denotes a drain electrode. In the present specification, numerals 1 and 2 may together denote a SiC substrate, and nitrogen is introduced to the surface (channel region) of the n$^-$ layer 2 or the interface between the gate dielectric film and the SiC substrate.

The gate dielectric film 6 is constituted by a laminated film containing a first gate dielectric film 6a, a silicon nitride film (SiN film) 6d, a metal oxide film 6b, a silicon nitride film (SiN film) 6e and a second gate dielectric film 6c that are formed sequentially from the side of the SiC substrate, in which the first gate dielectric film 6a and the second gate dielectric film 6c each may be formed, for example, of a silicon oxide film, and the metal oxide film 6b may be formed, for example, of a metal oxide film, such as an aluminum oxide. The silicon nitride films 6d and 6e are formed on and under the metal oxide film 6b, and the metal nitride films are each in contact with the metal oxide film. The first gate dielectric film 6a has a thickness of 3 nm or more, and the metal oxide film 6b is remote from the surface of the SiC substrate by 3 nm or more. The total thickness of the gate dielectric film 6 is from 30 to 100 nm. The proportion in thickness of the metal oxide film 6b occupied in the total gate dielectric film 6 is 10% or less.

In the operation of the MOSFET, on application of a positive voltage on the gate electrode 7 in the state where a voltage is applied between the drain electrode 10 and the source electrode 9, an electron inversion layer is formed on the surface of the p base region 3. As a result, an electric current flows from the drain electrode 10 to the source electrode 10 through the drain region 1, the drift layer 2 and the source region 5.

A production method of the silicon carbide semiconductor device according to Example 2 of the invention will be described. A substrate is prepared that has an n$^-$ drift layer 2 laminated on a SiC substrate 1. On the n$^-$ drift layer 2, which is formed on the SiC substrate 1, an ion implantation mask material is patterned, and Al is ion-implanted thereto for forming a p type base region 3. The ion implantation condition at this time is a dose amount of $3 \times 10^{13}$ cm$^{-2}$. According to the procedure, the p type base region 3 is formed to have a doping concentration of approximately from $1 \times 10^{17}$ to $1 \times 10^{16}$ cm$^{-3}$ and a thickness of approximately from 0.5 to 3.0 μm.

After forming the p type base region 3, an ion implantation mask material is patterned on the surface of the n$^-$ drift layer 2 and the p type base region 3, and Al is ion-implanted thereto for forming a p$^+$ contact region 4. After forming the p$^+$ contact region 4, an ion implantation mask material is patterned on the surface of n$^-$ drift layer 2, the p type base region 3 and the p$^+$ contact region 4, nitrogen is ion-implanted thereto for forming an n$^+$ source region 5. After forming the n$^+$ source region 5, an ion implantation mask material is patterned, and nitrogen is ion-implanted only to the n$^-$ drift layer 2 (channel region). According to the procedure, nitrogen is introduced to the channel region.

After removing the ion implantation mask material, a heat treatment at 1,700° C. is performed for activating Al and nitrogen thus implanted. A first gate dielectric film 6a is then formed by thermal oxidation within a process temperature range of approximately from 1,000 to 1,300° C. The first gate dielectric film 6a may be formed with NO gas or N$_2$O gas. According to the procedure, nitrogen is introduced to the interface between the SiC substrate and the gate dielectric film. The first gate dielectric film 6a has a thickness of 3 nm or more. A silicon nitride film (SiN film) 6d, a metal oxide film 6b, a silicon nitride film 6e and a second gate dielectric film 6c are then formed sequentially. The thickness of the metal oxide film 6b is 10% or less of the total thickness of the gate dielectric 6. The total thickness of the gate dielectric film 6 is from 30 to 100 nm. The metal oxide film may be, for example, an aluminum oxide.

A gate electrode 7 is then formed with polycrystalline silicon. Thereafter, an interlayer dielectric film 8 for electric insulation is formed on the surface of the gate electrode 7. An etching mask material is patterned on the interlayer dielectric film 8, and the interlayer dielectric film 6 and the gate dielectric film 6 are processed by dry etching to form a contact window for exposing the p$^+$ contact region 4 and the n$^+$ source region 5. Finally, after removing the mask material, a drain electrode 10 is formed on the surface of the substrate 1. Thereafter, a source electrode 9 is formed in the prescribed contact window for exposing the p+ contact region 4 and the n+ source region 5, thereby completing the MOSFET shown in FIG. 6.

In the production method, both the process of introducing nitrogen to the channel and the process of introducing nitrogen to the interface between the SiC substrate and the gate dielectric film are described, but this example includes a production method where one of the processes is not performed and the other thereof is performed for introducing nitrogen.

The silicon carbide semiconductor device of Example 2 provides the similar evaluation results as in Example 1, and the proportion in thickness of the metal oxide film 6b with respect to the total thickness of the gate dielectric film 6 is preferably 10% or less, and more preferably 5% or less. In addition, it is confirmed that the reliability is enhanced as compared to the structure of Example 1 where the silicon nitride films are not provided. Specifically, the TDDB (time-dependent dielectric breakdown) life time, the stability of Vth, and the like are enhanced. It is considered that this is because the metal atoms in the metal oxide film are prevented from being diffused to the gate dielectric film by the silicon nitride film.

In this example, an aluminum oxide is used as an example of the metal oxide film, but the invention is not limited thereto, and any one of a titanium oxide, a tantalum oxide, a hafnium oxide and a zirconium oxide may be used.

REFERENCE SIGNS LIST

1: n+ SiC substrate
2: n− type drift layer
3: p type base region
4: p+ type contact region
5: n+ type source region
6: gate dielectric film
7: gate electrode
8: interlayer dielectric film
9: source electrode
10: drain electrode

The invention claimed is:

1. A silicon carbide semiconductor device comprising a MOSFET containing a silicon carbide substrate, a gate dielectric film formed on the silicon carbide substrate, a gate electrode formed on the gate dielectric film, and a source region formed on the silicon carbide substrate,
    the silicon carbide semiconductor device containing
    nitrogen that is introduced to a channel region of the MOSFET or an interface between the silicon carbide substrate and the gate dielectric film, and
    a metal oxide film having a thickness of 10% or less of the gate dielectric film in the gate dielectric film,
    wherein silicon nitride films are formed on and under the metal oxide film, and the silicon nitride films are each in contact with the metal oxide film.

2. The silicon carbide semiconductor device according to claim 1, wherein the metal oxide film has a thickness of 5% or less of the gate dielectric film.

3. The silicon carbide semiconductor device according to claim 2, wherein the metal oxide film is remote from a surface of the silicon carbide substrate by 3 nm or more.

4. The silicon carbide semiconductor device according to claim 2, wherein the gate dielectric film has a thickness of from 30 to 100 nm.

5. The silicon carbide semiconductor device according to claim 2, wherein the metal oxide film contains an aluminum oxide, a titanium oxide, a tantalum oxide, a hafnium oxide or a zirconium oxide.

6. The silicon carbide semiconductor device according to claim 1, wherein the metal oxide film is remote from a surface of the silicon carbide substrate by 3 nm or more.

7. The silicon carbide semiconductor device according to claim 1, wherein the gate dielectric film has a thickness of from 30 to 100 nm.

8. The silicon carbide semiconductor device according to claim 1, wherein the metal oxide film contains an aluminum oxide, a titanium oxide, a tantalum oxide, a hafnium oxide or a zirconium oxide.

* * * * *